(12) United States Patent
Zhao et al.

(10) Patent No.: US 11,963,401 B2
(45) Date of Patent: Apr. 16, 2024

(54) DISPLAY PANEL AND METHOD FOR MANUFACTURING THE SAME, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Erjin Zhao, Beijing (CN); Zhiliang Jiang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 106 days.

(21) Appl. No.: 16/975,282

(22) PCT Filed: Oct. 30, 2019

(86) PCT No.: PCT/CN2019/114285
§ 371 (c)(1),
(2) Date: Aug. 24, 2020

(87) PCT Pub. No.: WO2021/081791
PCT Pub. Date: May 6, 2021

(65) Prior Publication Data
US 2021/0134904 A1    May 6, 2021

(51) Int. Cl.
*H10K 59/122* (2023.01)
*H10K 50/844* (2023.01)
*H10K 71/00* (2023.01)

(52) U.S. Cl.
CPC ......... *H10K 59/122* (2023.02); *H10K 50/844* (2023.02); *H10K 71/00* (2023.02)

(58) Field of Classification Search
CPC ....... H01L 51/5253–5256; H01L 51/56; H01L 27/3246; H10K 59/122; H10K 71/00; H10K 50/844
See application file for complete search history.

(56) References Cited

U.S. PATENT DOCUMENTS 10,388,908 B1 * 8/2019 Yu ........................... H01L 51/56
10,790,470 B1 * 9/2020 Li ......................... H01L 51/5256
(Continued)

FOREIGN PATENT DOCUMENTS

| CN | 203871312 U | 10/2014 |
|---|---|---|
| CN | 104423103 A | 3/2015 |

(Continued)

OTHER PUBLICATIONS

Extended European Search Report dated Oct. 13, 2022, relating to EP Patent Application No. 19945438.0.

*Primary Examiner* — Shaun M Campbell
(74) *Attorney, Agent, or Firm* — DINSMORE & SHOHL LLP

(57) ABSTRACT

Provided is a display panel and a method for manufacturing the same, and a display device. The display panel includes a display area and a peripheral area including a first and a second peripheral area. The peripheral area includes a substrate, a first planarization layer and a first dam located above the substrate, the first dam including a corner portion and a straight portion located at the first and second peripheral area respectively. An edge of an orthographic projection of the first planarization layer on the substrate away from the display area is a first edge, an edge of an orthographic projection of the first dam on the substrate close to the display area is a second edge; in the first and second peripheral area, a minimum distance between the first edge and the second edge is a first and a second distance greater than the first distance respectively.

17 Claims, 10 Drawing Sheets

(56) References Cited

U.S. PATENT DOCUMENTS

| | | | |
|---|---|---|---|
| 2011/0304812 A1 | 12/2011 | Hwang et al. | |
| 2015/0070602 A1 | 3/2015 | Fujita | |
| 2017/0244063 A1* | 8/2017 | Furuie | H01L 27/3272 |
| 2020/0161398 A1* | 5/2020 | Bang | H01L 23/3135 |
| 2020/0185647 A1* | 6/2020 | Lee | H01L 27/3246 |
| 2021/0028388 A1* | 1/2021 | Jiang | H10K 50/8428 |
| 2021/0351378 A1* | 11/2021 | Lee | H01L 51/5253 |
| 2021/0408471 A1* | 12/2021 | Xiao | H01L 27/3258 |

FOREIGN PATENT DOCUMENTS

| | | |
|---|---|---|
| CN | 109301084 A | 2/2019 |
| CN | 208904069 U | 5/2019 |
| EP | 3985735 A1 | 4/2022 |
| KR | 20190031042 A | 3/2019 |

\* cited by examiner

DISPLAY PANEL AND METHOD FOR MANUFACTURING THE SAME, AND DISPLAY DEVICE

CROSS-REFERENCE TO RELATED APPLICATIONS

The present application is a U.S. National Stage Application under 35 U.S.C. § 371 of International Patent Application No. PCT/CN2019/114285, filed on Oct. 30, 2019, the disclosure of which is incorporated by reference herein in its entirety.

TECHNICAL FIELD

The present disclosure relates to a display panel and a method for manufacturing the same, and a display device.

BACKGROUND

With the development of the display technology, the organic light emitting diode (OLED) display panel has developed rapidly due to own advantages.

The encapsulating performance of the OLED display panel may affect the display performance of the OLED display panel.

SUMMARY

According to one aspect of the embodiments of the present disclosure, provided is a display panel comprising a display area; and a peripheral area surrounding the display area and comprising a first peripheral area and a second peripheral area adjacent to the first peripheral area, the peripheral area comprising: a substrate, a first planarization layer located above the substrate, and a first dam located above the substrate and comprising a corner portion located at the first peripheral area and a straight portion located at the second peripheral area, the first planarization layer being closer to the display area than the first dam, wherein: an edge of an orthographic projection of the first planarization layer on the substrate away from the display area is a first edge, and an edge of an orthographic projection of the first dam on the substrate close to the display area is a second edge, in the first peripheral area, a minimum distance between the first edge and the second edge is a first distance, and in the second peripheral area, a minimum distance between the first edge and the second edge is a second distance greater than the first distance.

In some embodiments, the first dam comprises a first surface away from the substrate and a second surface close to the display area and adjacent to the first surface, wherein an angle between the second surface and the first surface is an obtuse angle.

In some embodiments, the first dam further comprises a third surface away from the display area and adjacent to the first surface, wherein an angle between the third surface and the first surface is an obtuse angle.

In some embodiments, the first dam comprises a first portion and a second portion covering the first portion.

In some embodiments, the display area comprises a second planarization layer, a third planarization layer located on the second planarization layer, a pixel defining layer located on the third planarization layer, and a spacer layer located on the pixel defining layer, wherein a material of the second planarization layer is the same as a material of the first planarization layer; a material of the first portion is the same as a material of one of the third planarization layer and the pixel defining layer; and a material of the second portion is the same as a material of one of the pixel defining layer and the spacer layer, and different from the material of the first portion.

In some embodiments, the first dam further comprises a third portion covering the second portion.

In some embodiments, the material of the first portion is the same as the material of the third planarization layer; the material of the second portion is the same as the material of the pixel defining layer; and a material of the third portion is the same as the material of the spacer layer.

In some embodiments, the material of the second planarization layer is integrally provided with the first planarization layer.

In some embodiments, the peripheral area further comprises a second dam located on one side of the first dam away from the display area and comprising a fourth portion, a fifth portion covering the fourth portion, a sixth portion covering the fifth portion, and a seventh portion covering the sixth portion, wherein: a material of the fourth portion is the same as the material of the second planarization layer; a material of the fifth portion is the same as the material of the third planarization layer; a material of the sixth portion is the same as the material of the pixel defining layer; and a material of the seventh portion is the same as the material of the spacer layer.

In some embodiments, the peripheral area further comprises an encapsulation layer comprising: a first inorganic layer, wherein an orthographic projection of first inorganic layer on the substrate covers the orthographic projection of the first planarization layer on the substrate, the orthographic projection of the first dam on the substrate and a portion between the first edge and the second edge; an organic layer located on one side of the first inorganic layer away from the substrate, wherein an edge of an orthographic projection of the organic layer on the substrate away from the display area is closer to the display area than the second edge; and a second inorganic layer covering a surface of the organic layer and a surface of the first inorganic layer not covered by the organic layer.

In some embodiments, the edge of the orthographic projection of the organic layer on the substrate away from the display area is located between the first edge and the second edge.

In some embodiments, the edge of the orthographic projection of the organic layer on the substrate away from the display area does not overlap with the first edge.

In some embodiments, the corner portion is adjacent to the straight portion.

In some embodiments, the first edge comprises a first corner edge and a first straight edge that intersect at M point, and the second edge comprises a second corner edge and a second straight edge that intersect at N point which is not on a same horizontal line with the M point.

In some embodiments, a ratio of a maximum distance between the first edge and the second edge to the minimum distance between the first edge and the second edge is less than or equal to 1.2.

In some embodiments, the corner portion is in an arc shape.

In some embodiments, the peripheral area further comprises: a first insulating layer located on the substrate; a second insulating layer located on one side of the first insulating layer away from the substrate; a third insulating layer located on one side of the second insulating layer away from the first insulating layer; and a first metal layer located on one side of the third insulating layer away from the second insulating layer, wherein the first planarization layer is located on the first metal layer.

According to another aspect of the embodiments of the present disclosure, provided is a display device, comprising the display panel according to any one of the above embodiments.

According to still another aspect of the embodiments of the present disclosure, provided is a method for manufacturing a display panel, comprising: forming a display area and a peripheral area surrounding the display area, the peripheral area comprising a first peripheral area and a second peripheral area adjacent to the first peripheral area, wherein forming the peripheral area comprises: providing a substrate; forming a first planarization layer above the substrate; and forming a first dam above the substrate, wherein the first dam comprises a corner portion located at the first peripheral area and a straight portion located at the second peripheral area, the first planarization layer being closer to the display area than the first dam, wherein: an edge of an orthographic projection of the first planarization layer on the substrate away from the display area is a first edge, and an edge of an orthographic projection of the first dam on the substrate close to the display area is a second edge, in the first peripheral area, a minimum distance between the first edge and the second edge is a first distance, and in the second peripheral area, a minimum distance between the first edge and the second edge is a second distance greater than the first distance.

In some embodiments, forming the first dam comprises: forming a first portion; and forming a second portion covering the first portion.

In some embodiments, the display area comprises a second planarization layer, a third planarization layer located on the second planarization layer, a pixel defining layer located on the third planarization layer, and a spacer layer located on the pixel defining layer, wherein a material of the second planarization layer is the same as a material of the first planarization layer; the first portion and one of the third planarization layer and the pixel defining layer are formed by a first patterning process; and the second portion and one of the pixel defining layer and the spacer layer are formed by a second patterning process, wherein a material of the second portion is different from a material of the first portion.

In some embodiments, forming the first dam further comprises: forming a third portion covering the second portion.

In some embodiments, the first portion and the third planarization layer are formed by the first patterning process; the second portion and the pixel defining layer are formed by the second patterning process; and the third portion and the spacer layer are formed by a third patterning process.

In some embodiments, forming the peripheral area further comprises forming an encapsulation layer, wherein forming the encapsulation layer comprises: forming a first inorganic layer, wherein an orthographic projection of first inorganic layer on the substrate covers the orthographic projection of the first planarization layer on the substrate, the orthographic projection of the first dam on the substrate and a portion between the first edge and the second edge; forming an organic layer located on one side of the first inorganic layer away from the substrate, wherein an edge of an orthographic projection of the organic layer on the substrate away from the display area is closer to the display area than the second edge; and forming a second inorganic layer covering a surface of the organic layer and a surface of the first inorganic layer not covered by the organic layer.

In some embodiments, forming the peripheral area further comprises: forming a first insulating layer on the substrate; forming a second insulating layer on one side of the first insulating layer away from the substrate; forming a third insulating layer on one side of the second insulating layer away from the first insulating layer; and forming a first metal layer on one side of the third insulating layer away from the second insulating layer, wherein the first planarization layer is formed on the first metal layer.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1A:
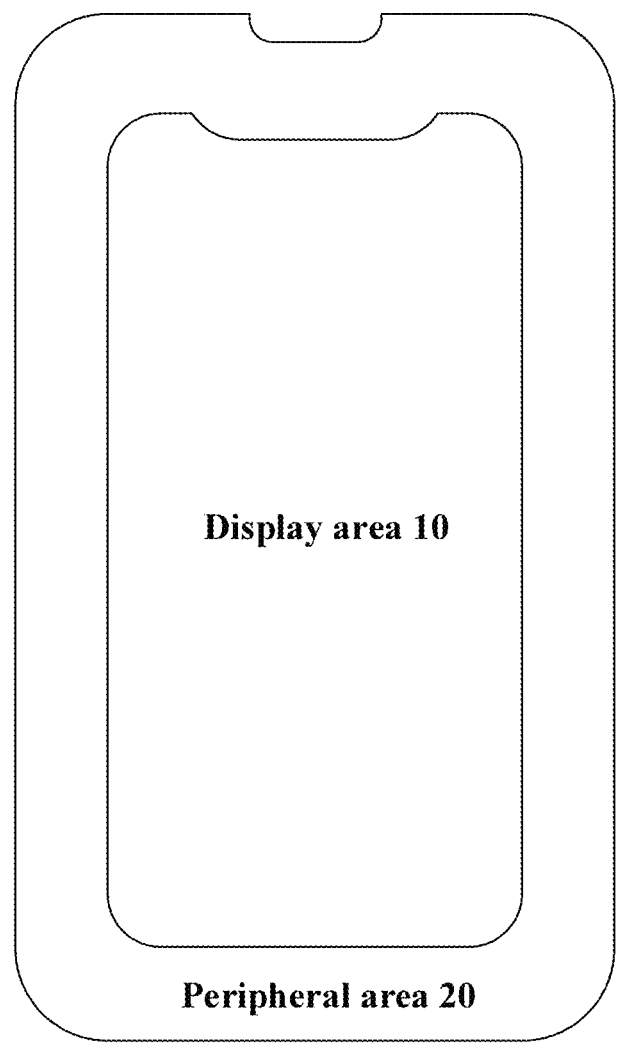
FIGS. 1A and 1B are schematic top views showing a display panel according to an embodiment of the present disclosure.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The inventors have noticed that area of the display area of the OLED display panel close to a corner is more prone to display defects such as growing dark spot (GDS) than other areas of the display area. In the related art, in order to more effectively prevent water vapor and oxygen from entering the display area, the planarization layer in the peripheral area is separated from a dam close to the display area in the peripheral area. However, during the process of forming an organic layer in an encapsulation layer, the organic layer is likely to climb over the dam. Once there is a crack in the encapsulation layer, water vapor and oxygen are likely to enter the organic layer along the crack in the encapsulation layer.

Accordingly, the embodiments of the present disclosure provide the following technical solutions.

Figure 1B:
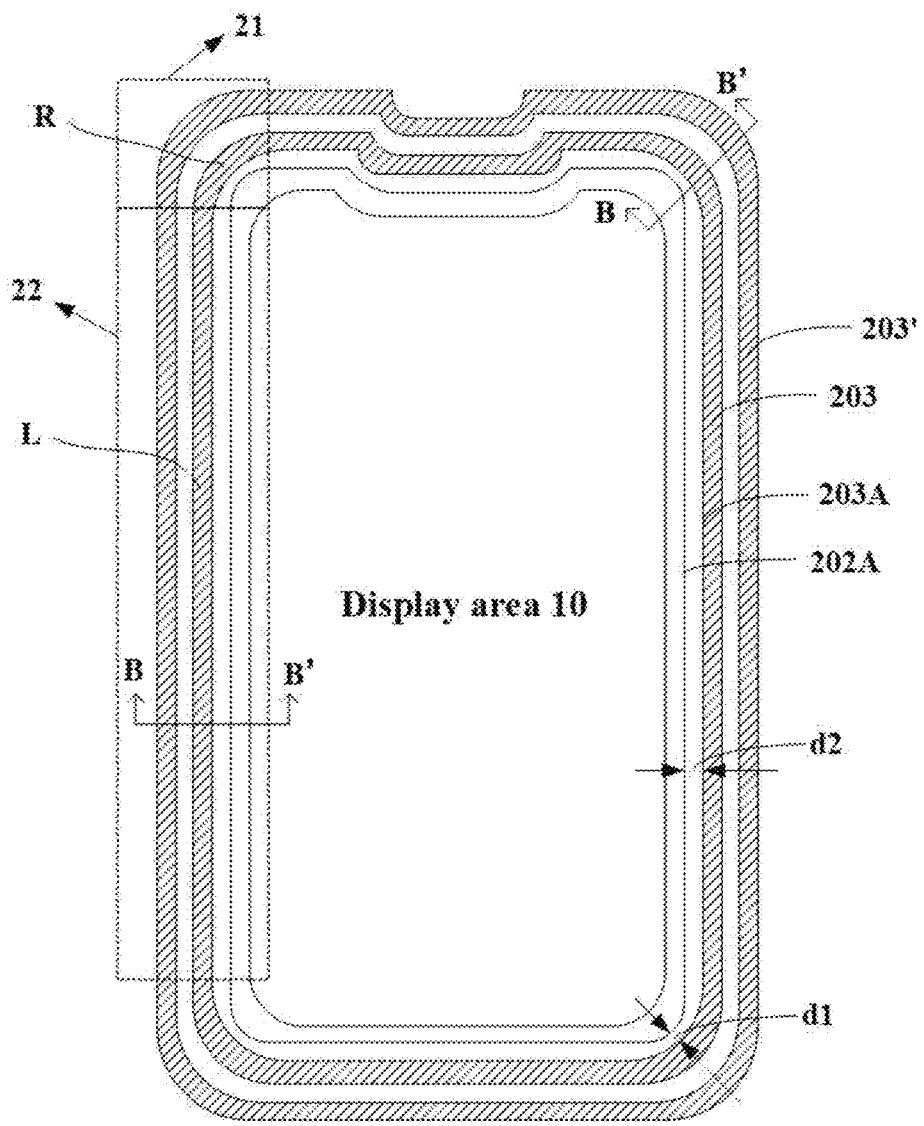

FIGS. 1A and 1B are schematic top views showing a display panel according to an embodiment of the present disclosure.

As shown in FIG. 1A, the display panel comprises a display area 10 and a peripheral area 20 surrounding the display area 10. Here, FIG. 1A shows the display area 10 and the peripheral area 20 in a simplified manner. FIG. 1B shows the structure of the peripheral area 20 in detail. The structure of the peripheral area 20 will be introduced below in conjunction with FIG. 1B.

As shown in FIG. 1B, the peripheral area 20 comprises a first peripheral area 21 and a second peripheral area 22 adjacent to the first peripheral area 21.

Figure 1C:
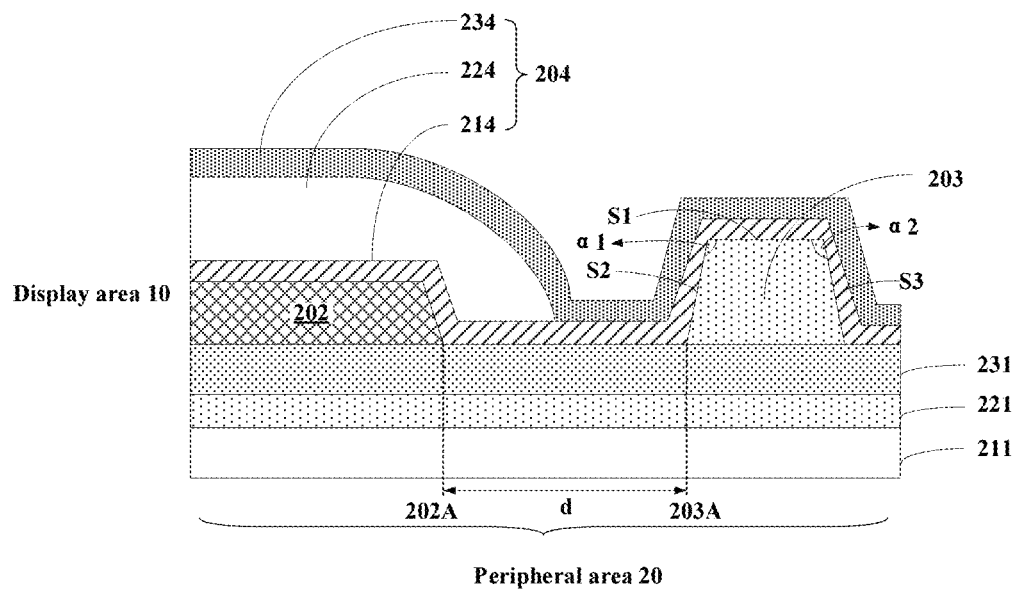
FIG. 1C is a schematic cross-sectional view taken along B-B' shown in FIG. 1B according to an embodiment of the present disclosure.

FIG. 1C is a schematic cross-sectional view taken along B-B' shown in FIG. 1A according to an embodiment of the present disclosure. Here, FIG. 1C focuses on showing the structure of the peripheral area 20 and shows the display area 10 in a simplified manner.

It should be noted that, as shown in FIG. 1B, B-B' may be located at the first peripheral area 21 or the second peripheral area 22. Therefore, the cross-sectional view shown in FIG. 1C may represent a schematic cross-sectional view taken along B-B' located at the first peripheral area 21, or a schematic cross-sectional view taken along B-B' located at the second peripheral area 22.

As shown in FIG. 1C, the peripheral area 20 comprises a substrate 211, a first planarization layer 202 located above the substrate 211, and a first dam 203 located above the substrate 211 and surrounding the display area 10. Here, the first planarization layer 202 is closer to the display area 10 than the first dam 203.

In some embodiments, the peripheral area 20 may further comprise a first insulating layer 221 on the substrate 211 and a second insulating layer 231 on one side of the first insulating layer 221 away from the substrate 211. It should be understood that the first insulating layer 221 and the second insulating layer 231 may extend from the display area 10 to the peripheral area 20, for example.

Referring to FIG. 1B, the first dam 203 comprises a corner portion R located at the first peripheral area 21 and a straight portion L located at the second peripheral area 22. In some embodiments, the corner portion R may be adjacent to the straight portion L. Here, the corner portion R may be located at the four top corners of the display area 10 or located at a special-shaped area of the display area 10, such as a notch area. In some embodiments, the corner portion R may, but not limited to, be in an arc shape.

It should be understood that the first dam 203 may comprise a plurality of corner portions R and a plurality of straight portions L. Each corner portion R is adjacent to two straight portions L, and each straight portion L is adjacent to two corner portions R. Correspondingly, the peripheral area 20 may comprise a plurality of first peripheral areas 21 and a plurality of second peripheral areas 22. Each first peripheral area 21 is adjacent to two second peripheral areas 22, and each second peripheral area 22 is adjacent to two first peripheral areas 21.

As shown in FIG. 1C, the edge of the orthographic projection of the first planarization layer 202 on the substrate 211 away from the display area 10 is defined as a first edge 202A, and the edge of the orthographic projection of the first dam 203 on the substrate 211 close to the display area 10 is defined as a second edge 203A. In addition, the minimum distance between the first edge 202A and the second edge 203A is defined as d. Here, the minimum distance d may be understood as the minimum value of distances between various points on the first edge 202A and various points on the second edge 203A.

Here, for the distinguishing purpose, the distance d between the first edge 202A and the second edge 203A in the first peripheral area 21 is referred to as a first distance d1, and the distance d between the first edge 202A and the second edge 203A in the second peripheral area 22 is referred to as a second distance d2.

FIG. 1B schematically shows the first distance d1 and the second distance d2. It can be seen from FIG. 1B that the second distance d2 is greater than the first distance d1. In some embodiments, the ratio of the maximum distance between the first edge 202A and the second edge 203A to the minimum distance between the first edge 202A and the second edge 203A is less than or equal to 1.2.

In the display panel of the above embodiments, the distance between the first edge 202A and the second edge 203A in the second peripheral area 22 is greater than the distance between the first edge 202A and the second edge 203A in the first peripheral area 21. In this way, the organic layer in the encapsulation layer of the first peripheral area 21 may be diverted to the second peripheral area 22, such that the organic layer is unlikely to climb over the first dam 203, thereby alleviating the problem of display defects in the area of the display area 10 close to the corner and improving the display effect of the display panel.

In some embodiments, referring to FIG. 1B, the peripheral area 20 may further comprise a second dam 203' surrounding the display area 10 and located on one side of the first dam 203 away from the display area 10. The height of the second dam 203' may be higher than that of the first dam 203, thereby preventing water vapor and oxygen from entering the display area 10 more effectively.

In some embodiments, as shown in FIG. 1C, the peripheral area 20 may further comprise an encapsulation layer 204. Here, the encapsulation layer 204 may comprise a first inorganic layer 214, an organic layer 224, and a second inorganic layer 234.

The orthographic projection of the first inorganic layer 214 on the substrate 211 covers the orthographic projection of the first planarization layer 202 on the substrate 211, the orthographic projection of the first dam 203 on the substrate 211, and a portion of the substrate 211 between the first edge 202A and the second edge 203A.

Figure 6:
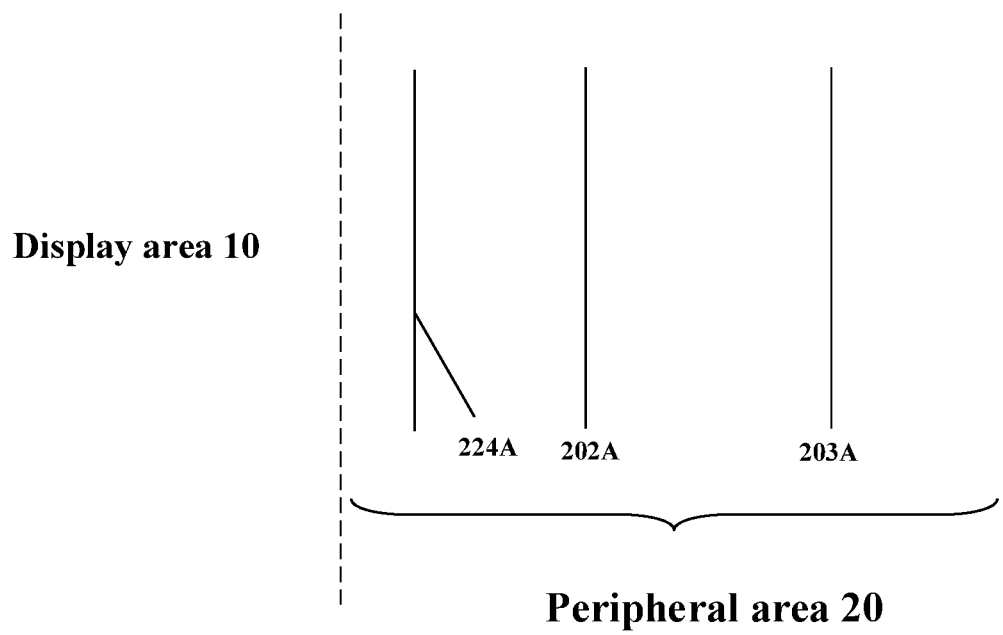
FIG. 6 is a plan view showing the edge of the orthographic projection of the organic layer away from the display area and the first edge according to some embodiments.

The organic layer 224 is located on one side of the first inorganic layer 214 away from the substrate 211. The edge of the orthographic projection of the organic layer 224 on the substrate 211 away from the display area 10 is closer to the display area 10 than the second edge 203A. That is, the organic layer 224 does not climb over the first dam 203. In some implementations, referring to FIG. 1C, the edge of the orthographic projection of the organic layer 224 on the substrate 211 away from the display area 10 is between the first edge 202A and the second edge 203A. In other implementations, refer to FIG. 6, the edge 224A of the orthographic projection of the organic layer 224 on the substrate 211 away from the display area 10 does not overlap with the first edge 202A. In other words, the edge 224A of the orthographic projection of the organic layer 224 on the substrate 211 away from the display area 10 is closer to the display area 10 than the first edge 202A.

The second inorganic layer 234 covers the surface of the organic layer 224 and the surface of the first inorganic layer 214 that is not covered by the organic layer 224. Here, the second inorganic layer 234 is in contact with the surface of the first inorganic layer 214 that is not covered by the organic layer 224.

As some implementations, the materials of the first inorganic layer 214 and the second inorganic layer 234 may comprise silicon oxide, silicon nitride, silicon oxynitride, or the like. As some implementations, the material of the organic layer 224 may comprise hexamethyldisiloxane (HMDSO), or the like.

In the above embodiments, the organic layer 224 in the encapsulation layer 204 does not climb over the first dam 203, and water vapor and oxygen are not likely to enter the display area 10 through the organic layer 224. In this way, the problem of display defects in the area of the display area close to a corner is further alleviated, and the display effect of the display panel is further improved.

Figure 1D:
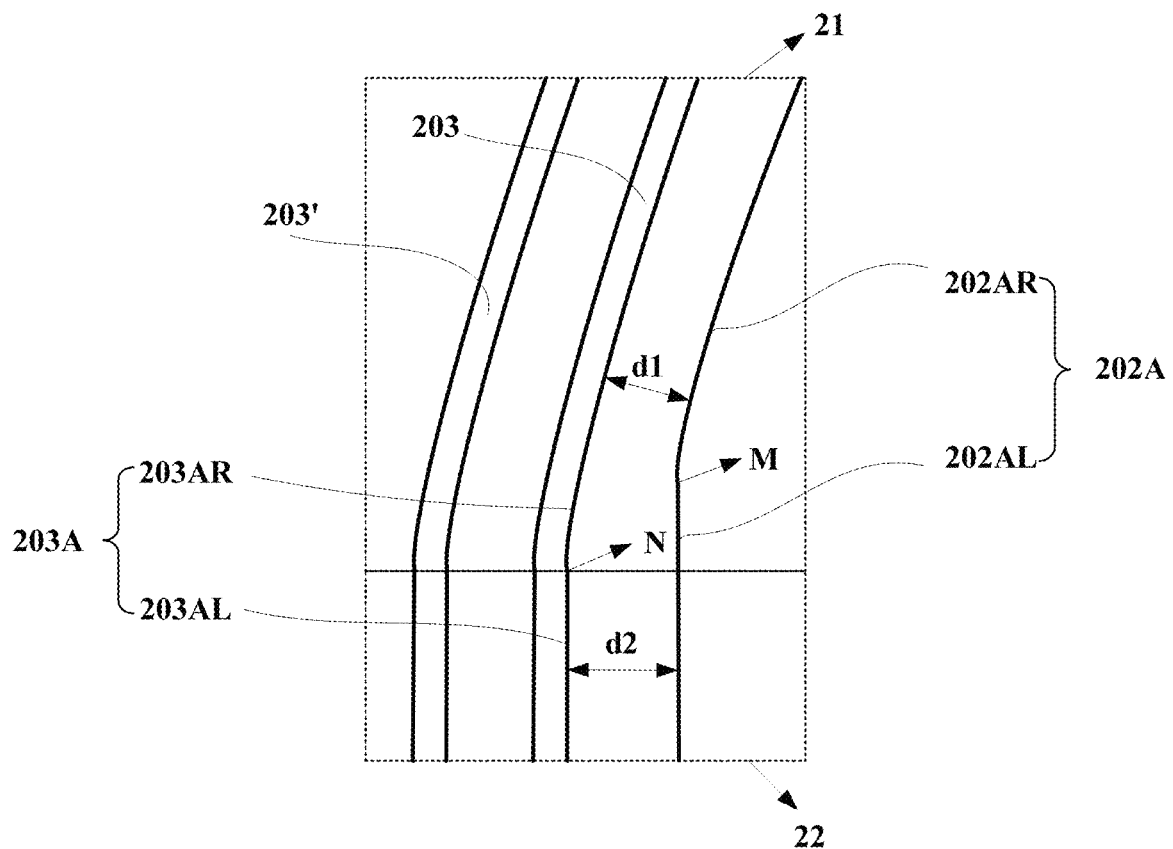
FIG. 1D is a partial enlarged schematic view showing a peripheral area according to an embodiment of the present disclosure.

FIG. 1D is a partial enlarged schematic view showing a peripheral area according to an embodiment of the present disclosure.

As shown in FIG. 1D, the first edge 202A may comprise a first corner edge 202AR and a first straight edge 202AL. The first corner edge 202AR intersects with the first straight edge 202AL at M point. In some implementations, the first corner edge 202AR is a curve. M may be understood as a point where the curvature of the first edge 202A changes suddenly.

The second edge 203A may comprise a second corner edge 203AR and a second straight edge 203AL. The second corner edge 203AR intersects with the second straight edge 203AL at N point. In some implementations, the second corner edge 203AR may be a curve. N may be understood as a point where the curvature of the second edge 203A changes suddenly. Here, the M point and the N point are not on the same horizontal line. The horizontal line may be, for example, a line extending in a row direction of pixels in the display area.

It can be seen from FIG. 1D that, in the first peripheral area 21, the distance between the first corner edge 202AR and the second corner edge 203AR along a extending direction of the horizontal line remains substantially constant, while the distance between the first straight edge 202AL and the second corner edge 203AR along the extending direction of the horizontal line gradually increases starting from the point M downward. In the second peripheral area 22, the distance between the first straight edge 202AL and the second straight edge 203AL along the extending direction of the horizontal line remains substantially constant.

Figure 2:
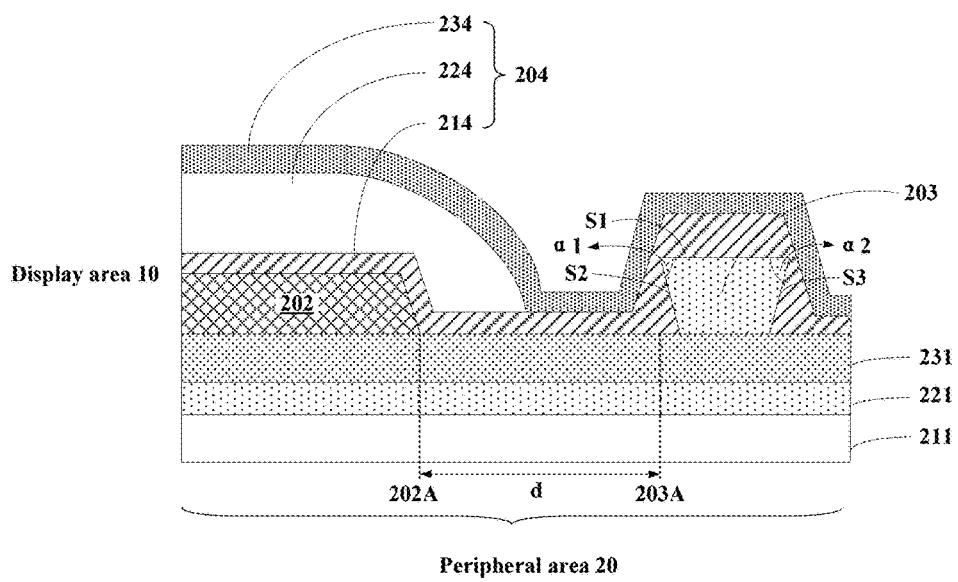
FIG. 2 is a schematic cross-sectional view taken along B-B' shown in FIG. 1B according to another embodiment of the present disclosure.

FIG. 2 is a schematic cross-sectional view taken along B-B' shown in FIG. 1B according to another embodiment of the present disclosure.

The following only focuses on the differences between the structure shown in FIG. 2 and the structure shown in FIG. 1C. For other similarities, reference may be made to the above description.

As shown in FIGS. 1C and 2, the first dam 203 may comprise a first surface S1, a second surface S2 adjacent to the first surface S1, and a third surface S3 adjacent to the first surface S1. Here, the first surface S1 is a surface of the first dam 203 away from the substrate 211. The second surface S2 is closer to the display area 10 than the third surface S3. In other words, the third surface S3 is farther away from the display area 10 than the second surface S2.

In FIG. 1C, the angle $\alpha1$ between the second surface S2 and the first surface S1 is an obtuse angle. In some embodiments, the angle $\alpha2$ between the third surface S3 and the first surface S1 is also an obtuse angle.

In FIG. 2, the angle $\alpha1$ between the second surface S2 and the first surface S1 is an acute angle. In the case where the angle $\alpha1$ is an acute angle, on one hand, water vapor and oxygen are less likely to enter the display area 10 through a crack in the encapsulation layer 204. On the other hand, the organic layer 224 in the encapsulation layer 204 is also further less likely to climb over the first dam 203, and water vapor and oxygen are further less likely to enter the display area 10 through the organic layer 224. Therefore, the problem of display defects of the area of the display area close to a corner is further alleviated, and the display effect of the display panel is further improved.

In some embodiments, referring to FIG. 2, the angle $\alpha2$ between the third surface S3 and the first surface S1 is also an acute angle. In such a display panel, water vapor and oxygen are further less likely to enter the display area 10 through a crack in the encapsulation layer 204, thereby further improving the display effect of the display panel.

Figure 3A:
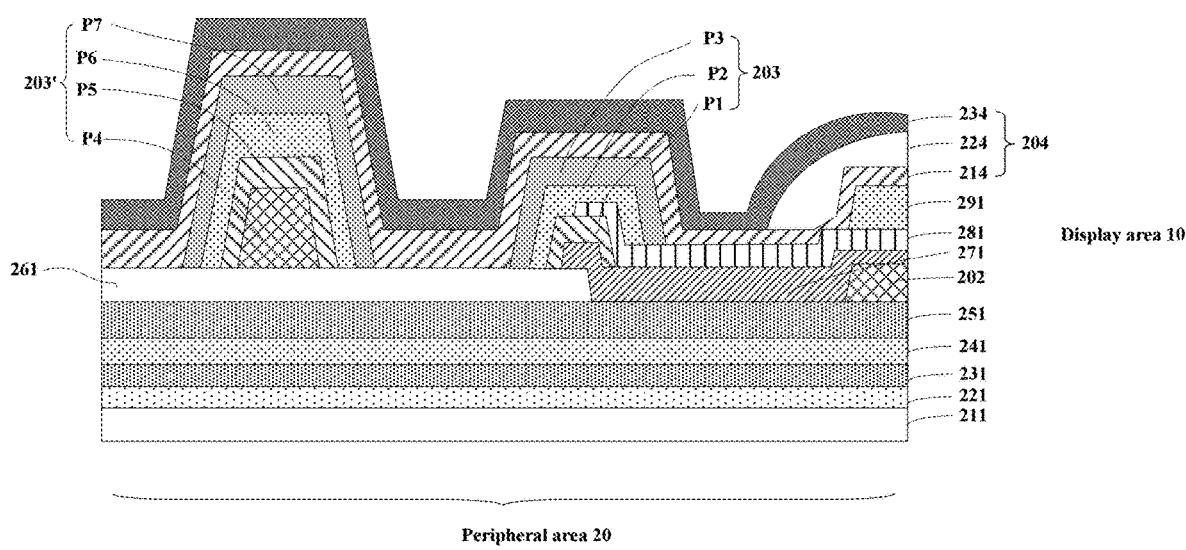
FIG. 3A is a schematic cross-sectional view taken along B-B' shown in FIG. 1B according to yet another embodiment of the present disclosure.
Figure 3B:
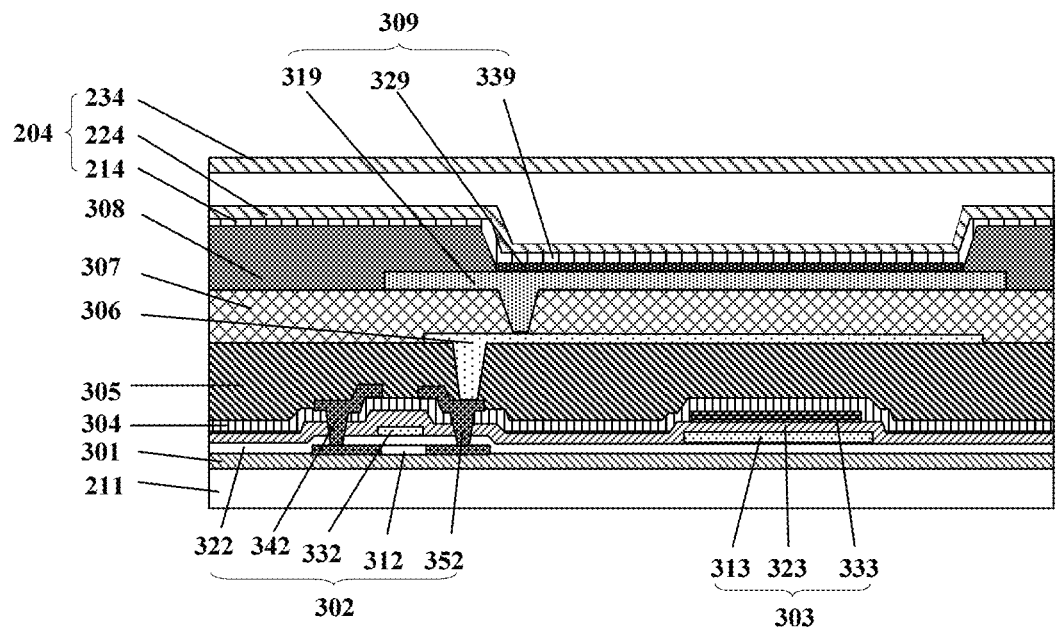
FIG. 3B is a schematic cross-sectional view showing a display area according to an embodiment of the present disclosure.

FIG. 3A is a schematic cross-sectional view taken along B-B' shown in FIG. 1B according to yet another embodiment of the present disclosure. FIG. 3B is a schematic cross-sectional view showing a display area according to an embodiment of the present disclosure. The structures of the peripheral area 20 and the display area 10 will be described below in conjunction with FIGS. 3A and 3B.

As shown in FIG. 3A, the peripheral area 20 may comprise a substrate 211, a first planarization layer 202 and a first dam 203 that are located above the substrate 211. In some embodiments, the peripheral area 20 may further comprise a first insulating layer 221 located on the substrate 211, a second insulating layer 231 located on one side of the first insulating layer 221 away from the substrate 211, a third insulating layer 241 located on one side of the second insulating layer 231 away from the first insulating layer 221, and a first metal layer 251 located on one side of the third insulating layer 241 away from the second insulating layer 231. The first planarization layer 202 is located on the first metal layer 251.

In some embodiments, referring to FIG. 3A, the first dam 203 may comprise a first portion P1 and a second portion P2 covering the first portion P1. In other embodiments, the first dam 203 may further comprise a third portion P3 covering the second portion P2.

In some embodiments, referring to FIG. 3B, the display area 10 comprises a second planarization layer 305, a third planarization layer 307 located on the second planarization layer 305, a pixel defining layer 308 located on the third planarization layer 307, and a spacer layer located on the pixel defining layer 308. Here, the material of the second planarization layer 305 is the same as that of the first planarization layer 202 in FIG. 3A. In some implementations, the second planarization layer 305 may be integrally provided with the first planarization layer 202. The materials of the first planarization layer 202, the second planarization layer 305, and the third planarization layer 307 may comprise, for example, organic insulating materials such as polyimide (PI), polyphthalimide, polyamide, acrylic resin, benzocyclobutene or phenolic resin.

An anode 319, a functional layer 329 and a cathode 339 constitute a light emitting device 309. Here, the pixel defining layer 308 is disposed on the anode 319, and the pixel defining layer 308 has an opening that exposes a part of the anode 319. The opening may be filled with the functional layer 329 and the cathode 339. The functional layer 329 may comprise, for example, a light emitting layer, an electron transport layer, an electron injection layer, a hole transport layer, a hole injection layer, and the like. When the light emitting layer is formed in the opening of the pixel defining layer 308, a mask is required. The spacer layer is configured to support the mask. As an example, the material of the spacer layer may comprise organic insulating materials such as polyimide (PI), polyphthalimide, polyamide, acrylic resin, benzocyclobutene or phenolic resin.

The second planarization layer 305 may cover a thin film transistor 302. The thin film transistor 302 may comprise an active layer 312, a fourth insulating layer 322, a gate 332, a source 342, and a drain 352. The third metal layer 306 located on the second planarization layer 305 may be connected to the drain 352 through a via penetrating the second planarization layer 305, and the anode 319 located on the third planarization layer 307 may be connected to the third metal layer 306 through a via penetrating the third planarization layer 307.

In some implementations, the active layer 312 is located on the substrate 211, the fourth insulating layer 322 is located on one side of the active layer 312 away from the substrate 211, the gate 332 is located on one side of the fourth insulating layer 322 away from the active layer 312, and the source 342 and the drain 352 are respectively connected to the active layer 312 through vias penetrating the fourth insulating layer 322. In some implementations, the surface of the substrate 211 may be provided with a buffer layer 301.

The second planarization layer 305 may also cover a capacitor 303. The capacitor 303 may comprise a first electrode plate 313, a fifth insulating layer 323, and a second electrode plate 333. Here, the first electrode plate 313 and the gate 332 may be formed by a same patterning process. The source 342, the drain 352, and the second electrode plate 333 may be formed by a same patterning process. In some implementations, the fifth insulating layer 323 may cover the gate 332. In some embodiments, a sixth insulating layer 304 may be provided between the second planarization layer 305 and the second electrode plate 333. For example, the sixth insulating layer 304 may extend to a surface of the fifth insulating layer 323.

In some embodiments, the first insulating layer 221 in FIG. 3A may be integrally provided with the fourth insulating layer 322 in FIG. 3B. The second insulating layer 231 in FIG. 3A may be integrally provided with the fifth insulating layer 323 in FIG. 3B. The third insulating layer 241 in FIG. 3A may be integrally provided with the sixth insulating layer 304 in FIG. 3B.

In some embodiments, the material of the first portion P1 may be the same as that of one of the third planarization layer 307 and the pixel defining layer 308, and the material of the second portion P2 may be the same as that of one of the pixel defining layer 308 and the spacer layer. Moreover, the material of the second portion P2 is different from that of the first portion P1. For example, the material of the first portion P1 may be the same as that of the third planarization layer 307, and the material of the second portion P2 may be the same as that of the pixel defining layer 308. For another example, the material of the first portion P1 may be the same as that of the pixel defining layer 308, and the material of the second portion P2 may be the same as that of the spacer layer.

In some embodiments, the material of the first portion P1 may be the same as that of the third planarization layer 307, the material of the second portion P2 may be the same as that of the pixel defining layer 308, and the material of the third portion P3 may be the same as that of the spacer.

In some embodiments, referring to FIG. 3A, the peripheral area 20 may further comprise a second dam 203' located on one side of the first dam 203 away from the display area 10. The second dam 203' may comprise a fourth portion P4, a fifth portion P5 covering the fourth portion P4, a sixth portion P6 covering the fifth portion P5, and a seventh portion P7 covering the sixth portion P6. The material of the fourth portion P4 may be the same as that of the second planarization layer 305 in the display area 10, and the material of the fifth portion P5 may be the same as that of the third planarization layer 307 in the display area 10. The material of the sixth portion P6 may be the same as that of the pixel defining layer 308 in the display area 10, and the material of the seventh portion P7 may be the same as that of the spacer layer in the display area 10.

In some embodiments, as shown in FIG. 3A, the peripheral area 20 may further comprise a passivation layer 261 located on the first metal layer 251. A part of the first dam 203 and the second dam 203' may be located on the passivation layer 261. For example, the material of the passivation layer 261 may comprise inorganic materials, such as silicon oxide, or the like.

In some embodiments, as shown in FIG. 3A, the peripheral area 20 may further comprise a second metal layer 271 located on the first metal layer 251. The second metal layer 271 may extend to the surface of the passivation layer 261 away from the substrate 211 and may extend to the surface of the first planarization layer 202 away from the substrate 211. For example, the material of the first metal layer 251 may be the same as that of the source 342 and the drain 352 of the thin film transistor 302 in the display area 10. For example, the material of the second metal layer 271 may be the same as that of the third metal layer 306 in the display area 10.

In some embodiments, as shown in FIG. 3A, the peripheral area 20 may further comprise a conductive layer 281 located on the second metal layer 271. For example, the material of the conductive layer 281 may be the same as that of the anode 319 in the display area 10. A part of the conductive layer 281 may extend between the first portion P1 and the second portion P2, and another part of the conductive layer 281 may be located on the second metal layer 271.

The present disclosure also provides a method for manufacturing a display panel. The method for manufacturing the display panel comprises a step of forming a display area with a corner and a peripheral area surrounding the display area. Here, the peripheral area comprises a first peripheral area and a second peripheral area adjacent to the first peripheral area.

FIGS. 4A-4F are schematic cross-sectional views showing structures obtained at different stages of forming a peripheral area according to some embodiments of the present disclosure.

Figure 4A:
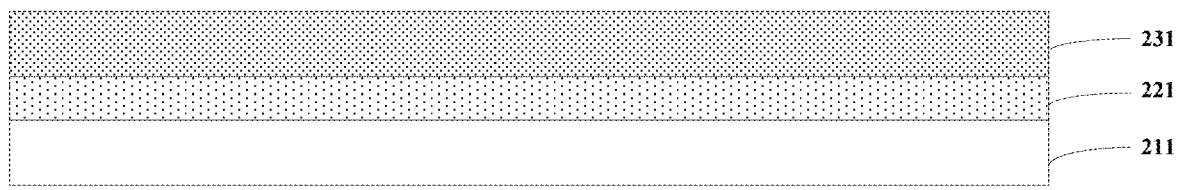
FIGS. 4A-4F are schematic cross-sectional views showing structures obtained at different stages of forming a non-display area according to some embodiments of the present disclosure.

First, a substrate 211 is provided, as shown in FIG. 4A.

Figure 4B:
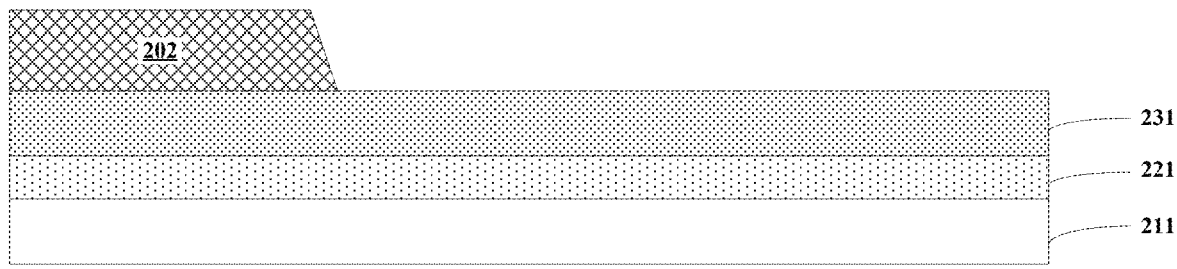

Next, a first planarization layer 202 is formed above the substrate 211, as shown in FIG. 4B. The material of the first planarization layer 202 may comprise, for example, a resin material or the like.

In some implementations, before the first planarization layer 202 is formed, a first insulating layer 221 may be first formed on the substrate 211, and then a second insulating layer 231 may be formed on one side of the first insulating layer 221 away from the substrate 211. After that, a third insulating layer and a first metal layer may be formed on one side of the second insulating layer 231 away from the first insulating layer 221. The first planarization layer 202 may be formed on the first metal layer. The material of the substrate 211 may comprise a flexible material such as PI. The materials of the first insulating layer 221 and the second insulating layer 231 may comprise, for example, silicon oxide, silicon nitride, silicon oxynitride, or the like. The material of the first metal layer may comprise aluminum, or the like, for example.

Next, a first dam 203 is formed above the substrate 211. The first planarization layer 202 is closer to the display area (not shown) located on the left side of the first planarization layer 202 than the first dam 203.

Figure 4C:
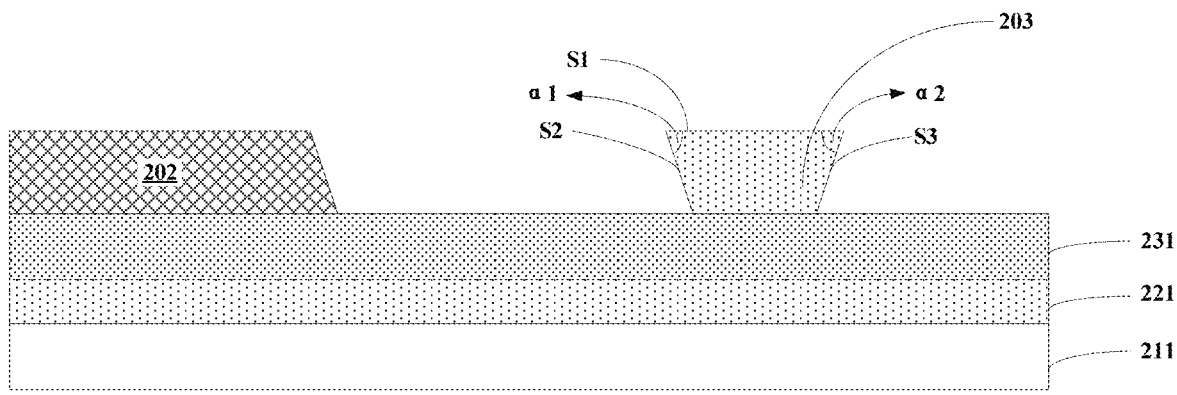

In some implementations, as shown in FIG. 4C, the first dam 203 may comprise a first surface S1 away from the substrate 211 and a second surface S2 close to the display area 10 and adjacent to the first surface S1. The angle α1 between the second surface S2 and the first surface S1 is an acute angle. In some embodiments, a certain layer in the first dam 203 and a certain layer (for example a pixel defining layer) in the display area may be formed by a same patterning process. Here, "by a same patterning process" means that a same material layer is patterned by a patterning process.

In some implementations, the first dam 203 may be formed in the following manner. First, a first portion is formed, and then a second portion covering the first portion is formed.

In some implementations, the first planarization layer 202 extends from the peripheral area 20 to the display area. The display area comprises a third planarization layer located on the second planarization layer, a pixel defining layer located on the third planarization layer, and a spacer layer located on the pixel defining layer. For example, the material of the second portion is different from that of the first portion. The first portion of the first dam 203 and one of the third planarization layer and the pixel defining layer in the display area may be formed by a first patterning process, and the second portion of the first dam 203 and one of the pixel defining layer and the spacer layer in the display area may be formed by a second patterning process.

In other implementations, a third portion covering the second portion may also be formed. For example, the first portion of the first dam 203 and the second planarization layer in the display area may be formed by the first patterning process. For example, the second portion of the first dam 203 and the pixel defining layer in the display area may be formed by the second patterning process. For example, the third portion of the first dam 203 and the spacer layer in the display area may be formed by a third patterning process.

After the first dam 203 is formed, in the first peripheral area 21, the distance between an edge (i.e., the first edge 202A) of the orthographic projection of the first planarization layer 202 on the substrate 211 away from the display area 10 and an edge (i.e., the second edge 203A) of the orthographic projection of the first dam 203 on the substrate 211 close to the display area 10 is a first distance d1. After the first dam 203 is formed, in the second peripheral area 22, the distance between the first edge 202A and the second edge 203A is a second distance d2. The second distance d2 is greater than the first distance d1.

Next, an encapsulation layer 204 is formed.

The process of forming the encapsulation layer 204 will be introduced below in conjunction with FIGS. 4D-4F.

Figure 4D:
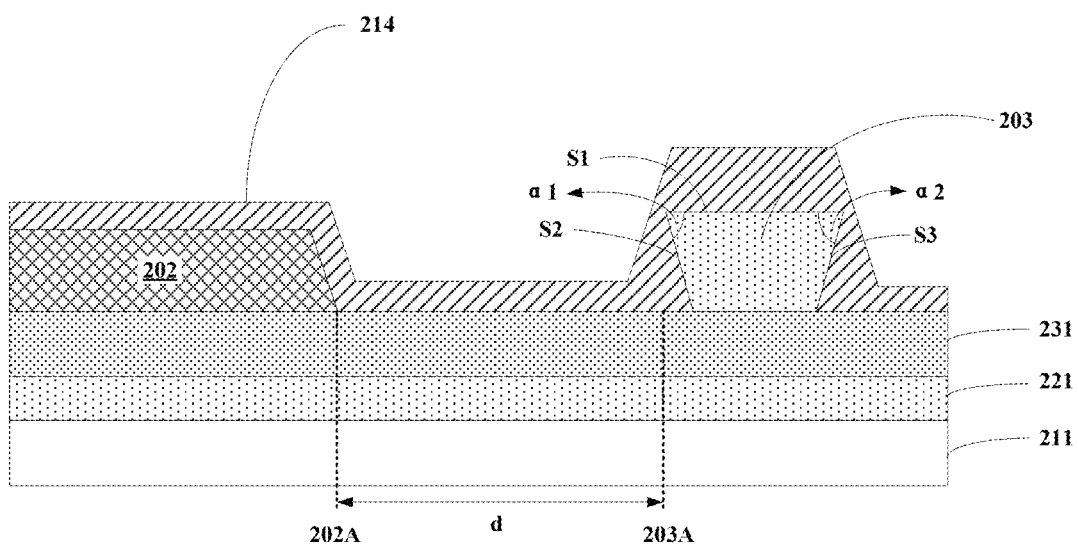

As shown in FIG. 4D, a first inorganic layer 214 is formed. For example, the first inorganic layer 214 may be formed by a process such as chemical vapor deposition (CVD).

The orthographic projection of the first inorganic layer 214 on the substrate 211 covers the orthographic projection of the first planarization layer 202 on the substrate 211, the orthographic projection of the first dam 203 on the substrate 211, and a portion of the substrate 211 between the first edge 202A and the second edge 203A.

Figure 4E:
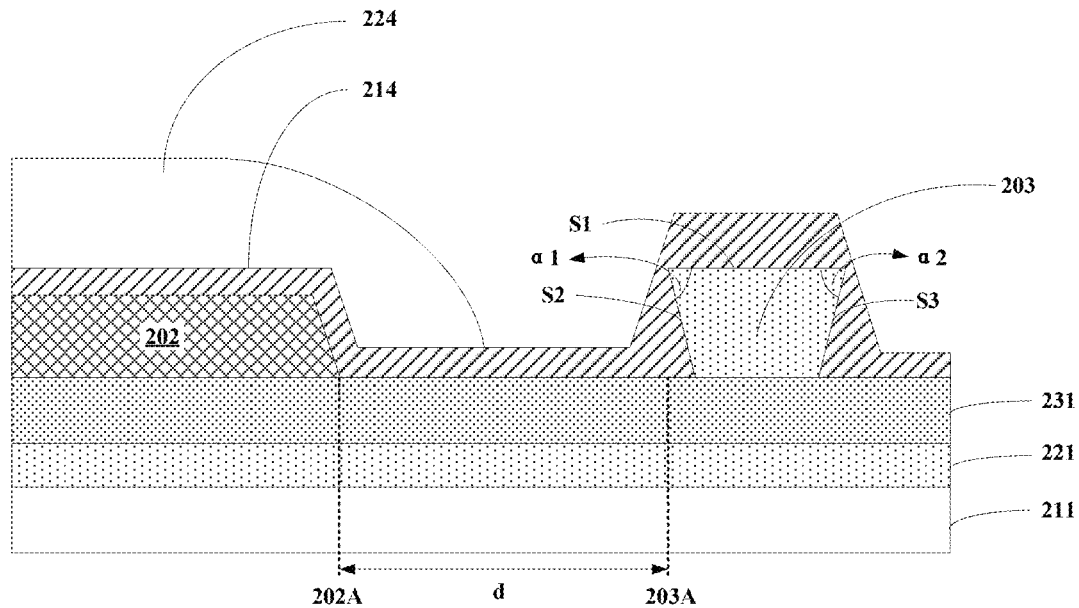

As shown in FIG. 4E, an organic layer 224 is formed. For example, the organic layer 224 may be formed by an inkjet printing process.

The organic layer 224 is located on one side of the first inorganic layer 214 away from the substrate 211. The edge of the orthographic projection of the organic layer 224 on the substrate 211 away from the display area 10 is closer to the display area 10 than the second edge 203A. For example, the edge of the orthographic projection of the organic layer 224 on the substrate 211 away from the display area 10 may be located between the first edge 202A and the second edge 203A.

Figure 4F:
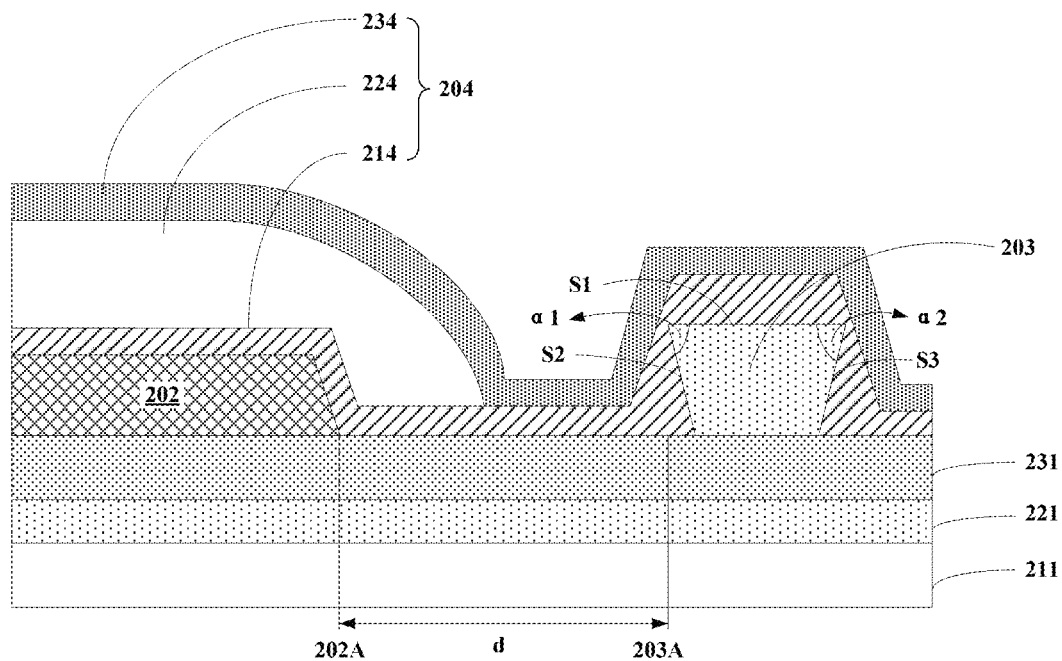

As shown in FIG. 4F, a second inorganic layer 234 is formed. For example, the second inorganic layer 234 may be formed by a process such as CVD.

Here, the second inorganic layer 234 covers the surface of the organic layer 224 and the surface of the first inorganic layer 214 that is not covered by the organic layer 224.

FIGS. 5A to 5E are schematic cross-sectional views showing structures obtained at different stages of forming the second portion of the first dam 203 according to some embodiments of the present disclosure. It should be understood that FIGS. 5A-5E only show the process of forming the second portion P2 and omit the process of forming other portions of the first dam 203.

Figure 5A:
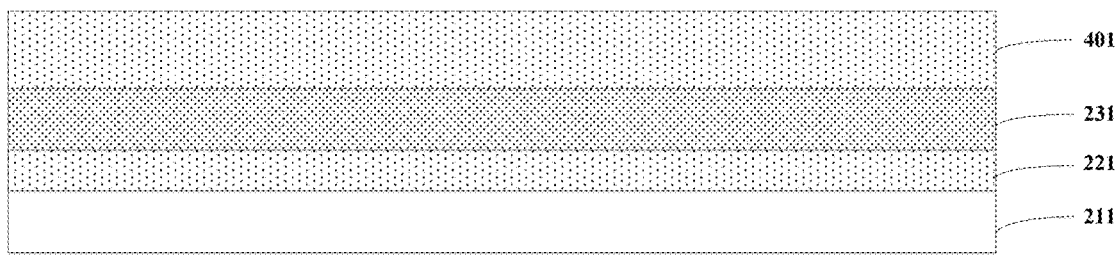
FIGS. 5A-5E are schematic cross-sectional views showing structures obtained at different stages of forming a second portion of a first dam according to some embodiments of the present disclosure.

First, as shown in FIG. 5A, a pixel defining material layer 401 is formed above the substrate 211. Here, a first insulating layer 221, a second insulating layer 231 and the like may be formed on the substrate 211.

Figure 5B:
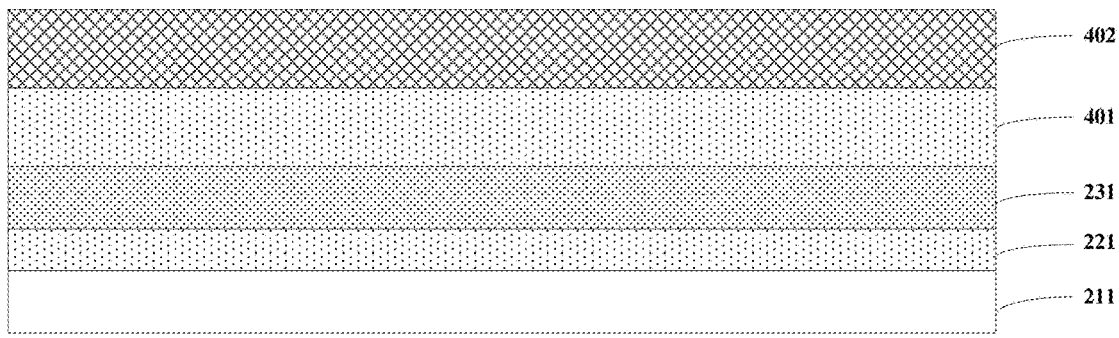

Next, as shown in FIG. 5B, a photoresist 402 is formed on one side of the pixel defining material layer 401 away from the substrate 211.

Figure 5C:
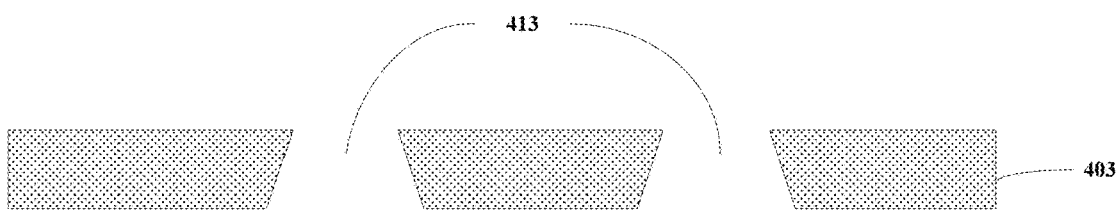
Figure 5C:
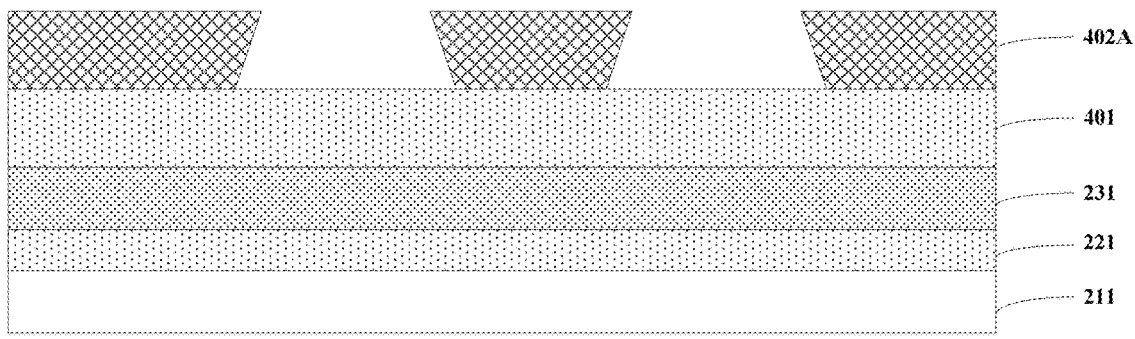

Then, as shown in FIG. 5C, the photoresist 402 is patterned by using the mask 403 to obtain a patterned photoresist 402A. Here, the mask 403 has openings 413 each of which has sizes gradually decrease in a direction from the substrate 211 to away from the substrate 211.

Figure 5D:
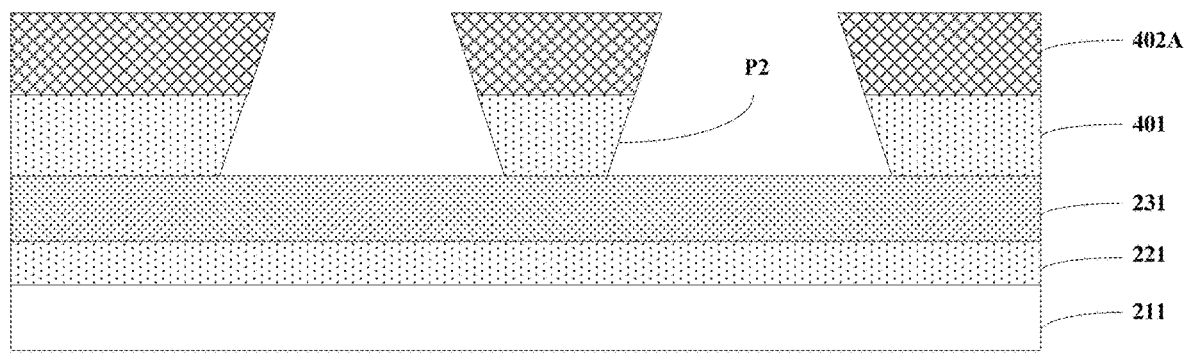

After that, as shown in FIG. 5D, with the patterned photoresist 402A as a mask, the pixel defining material layer 401 is etched to form the first dam 203 and a pixel defining layer in the display area (not shown).

Figure 5E:
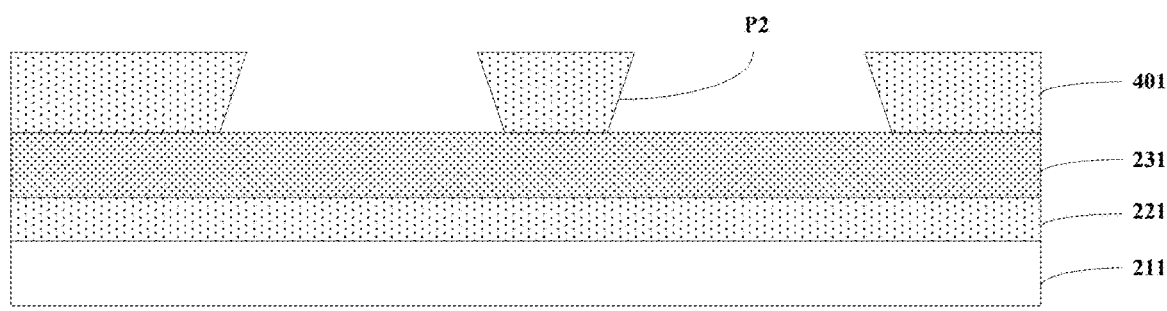

After that, as shown in FIG. 5E, the patterned photoresist 402A is removed.

During the processes shown in FIGS. 5A to 5E, the second portion P2 and the pixel defining layer in the display area are formed by a same patterning process. It should be understood that the second portion P2 and the pixel defining layer in the display area may also be formed by different patterning processes respectively in other embodiments.

The display panel provided by the embodiments of the present disclosure may be, for example, an OLED display panel.

In the embodiments of the present disclosure, a display device is also provided. The display device may comprise the display panel according to any one of the above embodiments. In some embodiments, the display device may be any product or member having a display function, such as a mobile terminal, a television, a display, a notebook computer, a digital photo frame, a navigator, or an electronic paper.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A display panel, comprising:
a display area comprising four corners, each of the four corners having a curved edge; and
a peripheral area surrounding the display area and comprising a first peripheral area and a second peripheral area adjacent to the first peripheral area, the peripheral area comprising:
a substrate,
a passivation layer and a first planarization layer located above the substrate,
a first dam located above the substrate and comprising a corner portion located at the first peripheral area and a straight portion located at the second peripheral area, the first planarization layer being closer to the display area than the first dam, the first dam being a dam closest to the display area, and the first dam comprising a first portion and a second portion covering the first portion,
a second dam located on one side of the first dam away from the display area, the second dam and a part of the first dam being located on the passivation layer,
a second metal layer extending to a surface of the passivation layer away from the substrate and extending to a surface of the first planarization layer away from the substrate,
a conductive layer, a part of the conductive layer extending between the first portion and the second portion, and another part of the conductive layer being located on the second metal layer, and a material of the conductive layer being the same as that of an anode in the display area, and
an encapsulation layer comprising a first inorganic layer and an organic layer on one side of the first inorganic layer away from the substrate, wherein the first inorganic layer is located above the first planarization layer and the first dam, wherein:
an edge of an orthographic projection of the first planarization layer on the substrate away from the display area is a first edge, and an edge of an orthographic projection of the first dam on the substrate close to the display area is a second edge,
in the first peripheral area, a minimum distance between the first edge and the second edge is a first distance, and
in the second peripheral area, a minimum distance between the first edge and the second edge is a second distance greater than the first distance, and
the organic layer covers a portion of the first inorganic layer between the first edge and the second edge, and remaining portion of the first inorganic layer between the first edge and the second edge is not covered by the organic layer, and the organic layer is not overlapped with the passivation layer.

2. The display panel according to claim 1, wherein the first dam comprises a first surface away from the substrate and a second surface close to the display area and adjacent to the first surface, wherein an angle between the second surface and the first surface is an acute angle.

3. The display panel according to claim 2, wherein the first dam further comprises a third surface away from the display area and adjacent to the first surface, wherein an angle between the third surface and the first surface is an acute angle.

4. The display panel according to claim 1, wherein:
the display area comprises a second planarization layer, a third planarization layer located on the second planarization layer, a pixel defining layer located on the third planarization layer, and a spacer layer located on the pixel defining layer, wherein a material of the second planarization layer is the same as a material of the first planarization layer;
a material of the first portion is the same as a material of one of the third planarization layer and the pixel defining layer; and
a material of the second portion is the same as a material of one of the pixel defining layer and the spacer layer, and different from the material of the first portion.

5. The display panel according to claim 4, wherein the first dam further comprises a third portion covering the second portion, wherein:
the material of the first portion is the same as the material of the third planarization layer;
the material of the second portion is the same as the material of the pixel defining layer; and
a material of the third portion is the same as the material of the spacer layer.

6. The display panel according to claim 4, wherein the second planarization layer is integrally provided with the first planarization layer.

7. The display panel according to claim 4, wherein the second dam comprising comprises a fourth portion, a fifth portion covering the fourth portion, a sixth portion covering the fifth portion, and a seventh portion covering the sixth portion, wherein:
a material of the fourth portion is the same as the material of the second planarization layer;
a material of the fifth portion is the same as the material of the third planarization layer;
a material of the sixth portion is the same as the material of the pixel defining layer; and
a material of the seventh portion is the same as the material of the spacer layer.

8. The display panel according to claim 1, wherein the encapsulation layer comprises:
the first inorganic layer, wherein an orthographic projection of first inorganic layer on the substrate covers the orthographic projection of the first planarization layer on the substrate, the orthographic projection of the first dam on the substrate and a portion of the substrate between the first edge and the second edge;
the organic layer located on one side of the first inorganic layer away from the substrate, wherein an edge of an orthographic projection of the organic layer on the substrate away from the display area is closer to the display area than the second edge; and
a second inorganic layer covering a surface of the organic layer and a surface of the first inorganic layer not covered by the organic layer.

9. The display panel according to claim 1, wherein the corner portion is adjacent to the straight portion.

10. The display panel according to claim 1, wherein the first edge comprises a first corner edge and a first straight edge that intersect at M point, and the second edge comprises a second corner edge and a second straight edge that intersect at N point which is not on a same horizontal line with the M point.

11. The display panel according to claim 1, wherein a ratio of a maximum distance between the first edge and the second edge to the minimum distance between the first edge and the second edge is less than or equal to 1.2.

12. The display panel according to claim 1, wherein the corner portion is in an arc shape.

13. The display panel according to claim 1, wherein the peripheral area further comprises:
a first insulating layer located on the substrate;
a second insulating layer located on one side of the first insulating layer away from the substrate;
a third insulating layer located on one side of the second insulating layer away from the first insulating layer; and
a first metal layer located on one side of the third insulating layer away from the second insulating layer, wherein the first planarization layer is located on the first metal layer.

14. A display device, comprising the display panel according to claim 1.

15. A display device, comprising the display panel according to claim 3.

16. A method for manufacturing a display panel, comprising: forming a display area and a peripheral area surrounding the display area, the display area comprising four corners, each of the four corners having a curved edge, and the peripheral area comprising a first peripheral area and a second peripheral area adjacent to the first peripheral area, wherein forming the peripheral area comprises:
providing a substrate;
forming a passivation layer and a first planarization layer above the substrate;
forming a first dam and a second dam above the substrate, wherein the first dam comprises a corner portion located at the first peripheral area and a straight portion located at the second peripheral area, the first planarization layer being closer to the display area than the first dam, the first dam being a dam closest to the display area, the first dam comprising a first portion and a second portion covering the first portion, the second dam being located on one side of the first dam away from the display area, and the second dam and a part of the first dam being located on the passivation layer,
forming a second metal layer extending to a surface of the passivation layer away from the substrate and extending to a surface of the first planarization layer away from the substrate,
forming a conductive layer, a part of the conductive layer extending between the first portion and the second portion, and another part of the conductive layer being located on the second metal layer, and a material of the conductive layer being the same as that of an anode in the display area, and
forming an encapsulation layer, wherein forming the encapsulation layer comprises forming a first inorganic layer and an organic layer on one side of the first inorganic layer away from the substrate, wherein the first inorganic layer is located above the first planarization layer and the first dam, wherein:
an edge of an orthographic projection of the first planarization layer on the substrate away from the display area is a first edge, and an edge of an orthographic projection of the first dam on the substrate close to the display area is a second edge,
in the first peripheral area, a minimum distance between the first edge and the second edge is a first distance, and
in the second peripheral area, a minimum distance between the first edge and the second edge is a second distance greater than the first distance, and
the organic layer covers a portion of the first inorganic layer between the first edge and the second edge, and a remaining portion of the first inorganic layer between the first edge and the second edge is not covered by the organic layer.

17. The method according to claim 16, wherein forming the encapsulation layer comprises:
   forming the first inorganic layer, wherein an orthographic projection of first inorganic layer on the substrate covers the orthographic projection of the first planarization layer on the substrate, the orthographic projection of the first dam on the substrate and a portion of the substrate between the first edge and the second edge;
   forming the organic layer located on one side of the first inorganic layer away from the substrate, wherein an edge of an orthographic projection of the organic layer on the substrate away from the display area is closer to the display area than the second edge; and
   forming a second inorganic layer covering a surface of the organic layer and a surface of the first inorganic layer not covered by the organic layer.

* * * * *